US009959934B2

(12) United States Patent
 Vo

(10) Patent No.: US 9,959,934 B2
(45) Date of Patent: May 1, 2018

(54) HIGH-SPEED DIFFERENTIAL CURRENT SENSING OF PREPROGRAMMED NVM CELLS

(71) Applicant: Kilopass Technology, Inc., San Jose, CA (US)

(72) Inventor: Chinh Vo, San Jose, CA (US)

(73) Assignee: Kilopass Technology, Inc., San Jose, CA (US)

( * ) Notice: Subject to any disclaimer, the term of this patent is extended or adjusted under 35 U.S.C. 154(b) by 0 days. days.

(21) Appl. No.: 15/283,195

(22) Filed: Sep. 30, 2016

(65) Prior Publication Data

US 2018/0096730 A1  Apr. 5, 2018

(51) Int. Cl.
G11C 7/00 (2006.01)
G11C 17/18 (2006.01)
G11C 17/16 (2006.01)
G11C 7/06 (2006.01)

(52) U.S. Cl.
CPC .............. *G11C 17/18* (2013.01); *G11C 17/16* (2013.01); *G11C 7/06* (2013.01)

(58) Field of Classification Search
None
See application file for complete search history.

(56) References Cited

U.S. PATENT DOCUMENTS

| 4,785,427 | A | 11/1988 | Young | |
|---|---|---|---|---|
| 5,929,659 | A * | 7/1999 | Pantelakis | G11C 7/062 327/215 |
| 7,495,983 | B2 | 2/2009 | Kim | |
| 9,159,398 | B2 | 10/2015 | Mok et al. | |
| 9,293,195 | B2 | 3/2016 | Mui et al. | |
| 2008/0043514 | A1* | 2/2008 | Ueda | G11C 7/02 365/148 |
| 2012/0182782 | A1* | 7/2012 | Kurjanowicz | G11C 17/16 365/94 |
| 2014/0211568 | A1* | 7/2014 | Mui | G11C 11/5642 365/185.21 |

* cited by examiner

*Primary Examiner* — Son Dinh
*Assistant Examiner* — Uyen B Tran
(74) *Attorney, Agent, or Firm* — Fenwick & West LLP

(57) ABSTRACT

A differential current sensing circuit architecture is used with an integrated circuit NVM memory block in which a selected memory cell and a related complementary memory cell are accessed at the same time for reading. The circuit architecture is used not only for normal operations for reading the logic states of a selected memory cell and its complementary memory cell after programming, but also for reading the logic states of a selected memory cell and its complementary memory cell before programming for the detecting of faults in memory cells.

20 Claims, 2 Drawing Sheets

HIGH-SPEED DIFFERENTIAL CURRENT SENSING OF PREPROGRAMMED NVM CELLS

BACKGROUND OF THE INVENTION

This invention relates to the sensing of NVM (Non-Volatile Memory) semiconductor cells and, in particular, sensing the NVM memory cells by differential pair current sensing techniques.

There are many types of NVM semiconductor cells, such as ROM (Read-Only Memory), EPROM (Erasable ROM), EEPROM (Electrically Erasable ROM), flash memory and OTP (One-Time Programmable) cells. In a NVM memory, the conventional sensing technique is a single-ended with the voltage developed on a selected bit line compared to an analog reference voltage. That is, to read the data in a selected NVM memory cell, only a single line, the bit line, from the NVM memory cell is used to sense the data in the NVM memory cell in a reading operation.

On the other hand, in some of the assignee's applications the bit line and its complementary bit line of the selected NVM memory cells are differentially sensed. That is, in the programming of a selected memory cell there are two possibilities: that the cell connected to the bit line is to be programmed or a related cell connected to the complementary bit line is to be programmed. Hence to read the contents of a memory cell at a particular address, there are two available memory cells, each with complementary programmed states. This allows for current differential sensing, such as found in SRAM (Static Random Access Memory) integrated circuits, in which the sense amplifier of cross-coupled inverter circuits permit the complementary states of the selected memory cell and its complement to pull the sense amplifier into one state or its complementary state quickly.

However, for reading the NVM memory cells in their pre-programmed states, the current differential technique for SRAM integrated circuits cannot be used. By definition there is no pair of programmed and unprogrammed memory cells; except for faulty cells, all preprogrammed memory cells are supposedly unprogrammed. Hence another circuit must be used for reading the memory cell prior to programming. Presently a current differential sense technique is used with 2 cycles of sensing. One cycle is for the bit line and the other cycle is for complementary bit line by alternating connections of the bit line and the complementary bit line into an operational amplifier (OP comparator). This technique allows for the integrity of the memory cells at the pre-programmed stage to be checked.

Hence it would desirable to take advantage of the described memory structure to achieve a fast current sensing scheme using differential currents between the bitline and the complementary bitline. The invention uses the SRAM sensing architecture for normal sensing and expands it into current sensing for reading and detecting faults in preprogrammed NVM memory cells.

BRIEF SUMMARY OF THE INVENTION

The present invention provides for an integrated circuit sensing circuit architecture to read the logic states of the selected memory cell and complementary memory cell in a NVM (non-volatile memory) block prior to programming. The NVM (non-volatile memory) block has a plurality of memory cells in which a selected memory cell and a complementary memory cell are addressed at a time. The sensing circuit architecture comprises: a first bit line connected to the selected memory cell; a second bit line connected to the complementary memory cell; a sense amplifier having first and second cross-coupled inverters, the first inverter having an input connected to the first bit line and an output connected to the second bit line, the second inverter having an input connected to the second bit line and an output connected to the first bit line, the sense amplifier operating by differential currents in the first and second bit lines; a first current source/sink controllably connected to the first bit line when a logic state of a complementary memory cell of the selected memory cell is read prior to programming of the complementary memory cell; and a second current source/sink controllably connected to the second bit line when a logic state of the selected memory cell is read prior to programming of the selected memory cell; whereby the memory cells in the NVM block are read by differential current sensing.

The present invention also provides for a method of operating a sensing architecture to read the logic states of the selected memory cell and complementary memory cell prior to programming. The memory cells are in an integrated circuit NVM (non-volatile memory) block in which a selected memory cell and a complementary memory cell are addressed at a time. The method comprises: connecting a first bit line to a selected preprogrammed memory cell; connecting a second bit line to a complementary preprogrammed memory cell of the selected memory cell; connecting a first current source/sink to the first bit line when a logic state of a complementary memory cell of the selected memory cell is to be read; connecting a second current source/sink connected to the second bit line when a logic state of the selected memory cell is to be read; and connecting the first and second bit lines to a sense amplifier having first and second cross-coupled inverters, the first inverter having an input connected to the first bit line and an output connected to the second bit line, the second inverter having an input connected to the second bit line and an output connected to the first bit line, the sense amplifier into one of two states in response to differential currents in the first and second bit lines; whereby the selected preprogrammed memory cells and the complementary preprogrammed memory cells in the NVM block are read by differential current sensing.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
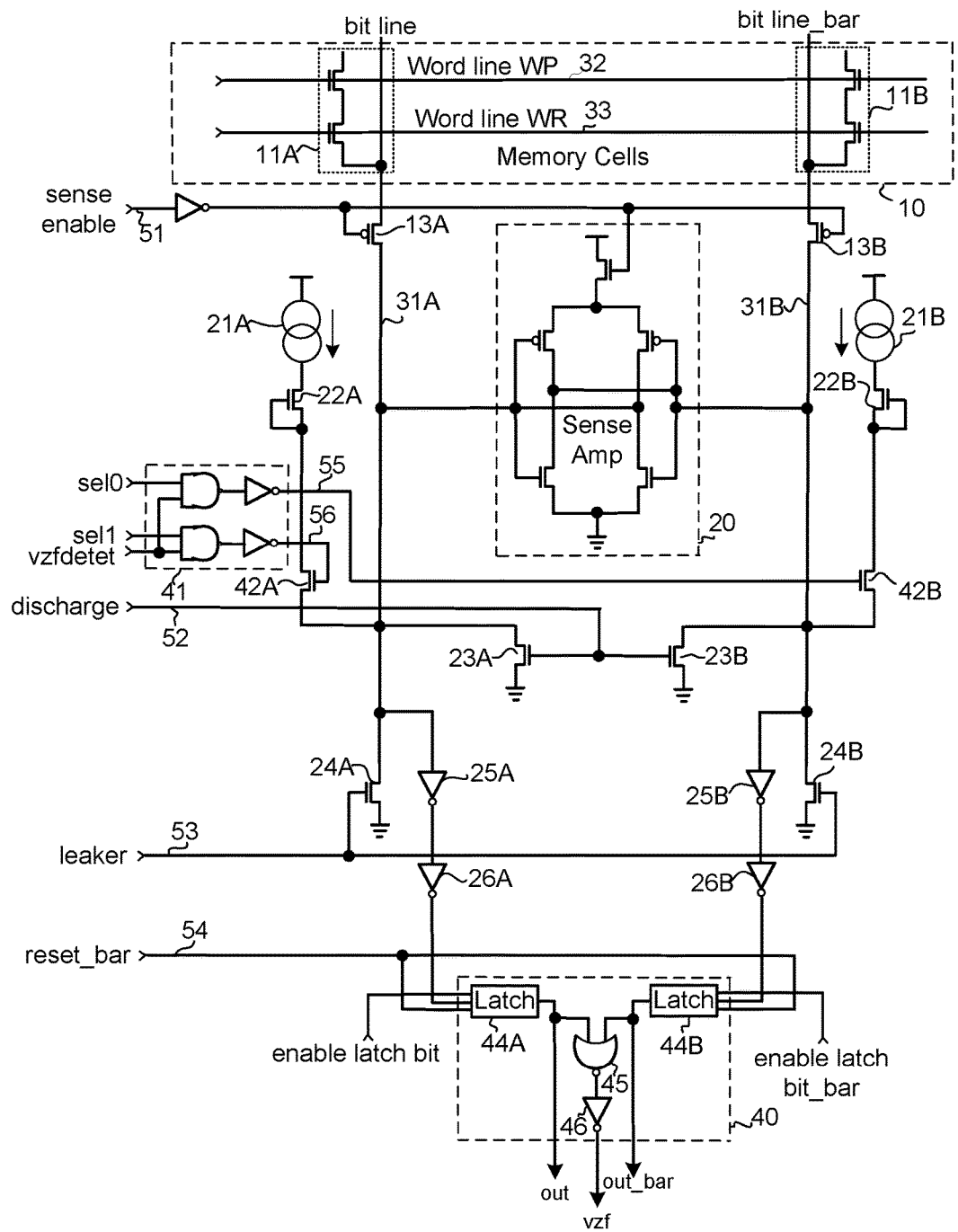
FIG. 1 shows the differential sensing circuit architecture of one embodiment of the present invention.
Figure 2:
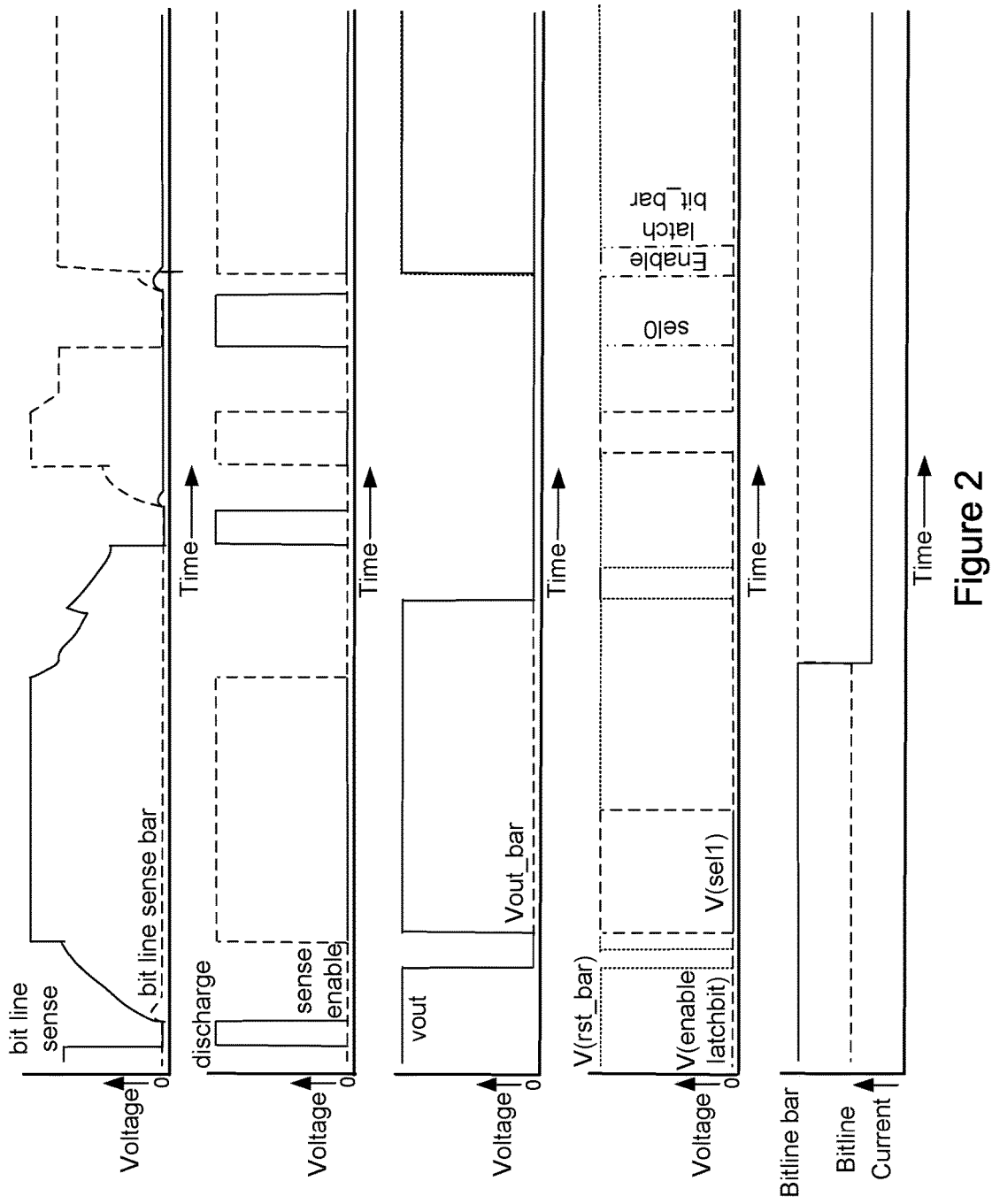
FIG. 2 shows various signal waveforms and their timing for the FIG. 1 circuit architecture.

FIG. 1 shows the circuit architecture of one embodiment of the present invention. A block 10 of NVM memory cells is connected to a sense amplifier 20 by a bit line 31A and its complementary bit line 31B through PMOS transistors 13A and 13B respectively. Through the bit lines 31A and 31B, the sense amplifier 10 drives an output latch/logic block 40.

Various control lines 51-56, including those from a control logic block 41, handle and time the current sensing operations and are described below. All of these elements are part of an integrated circuit implemented in standard CMOS technology.

The memory block 10 has a plurality of NVM, specifically OTP (One-Time Programmable), memory cells. Memory cell 11A represents the cells connected to the bit line 31A and memory cell 11B represents the cells connected to the complementary bit line 31B. Each of the memory cells 11A, 11B is also connected to word lines, word line WP 32 and word line WR 33. The word line 33, which is connected to the gate of the pass transistor of the memory cells 11A and 11B, addresses the selected cell for a read operation and the word line 32, which is connected to the gate of the programming element of the cells 11A, 11B, is also engaged for programming the selected cell. The OTP cells in the memory block 10 are programmed so that one of two memory cells, a memory cell 11A connected to a bit line 31A and its complementary cell 11B connected to the complementary bit line 31B, is programmed. How the particular memory cell is selected is beyond the scope of this invention.

In a normal read operation, i.e., an operation to sense the state of a programmed cell, the word line 33 addresses a memory cell 11A and its complementary cell 11B. As stated earlier, only one of the cells is the "actual" addressed cell and only one of the cells is programmed. The input/outputs of the sense amplifier 20 are connected to the bit line 13A and complementary bit line 31B. As is well understood by circuit designers, the cross-coupled inverter circuits of the sense amplifier 20 respond to the differential in the currents (and voltages) on the bit line 31A and complementary bit line 31B by flipping into one state or another. That is, the bit line current differential causes one of the logic inverters into a "1" state and the other logic inverter into a "0" state.

Connected to the sense amplifier 20 by the bit line 31A and complementary bit line 31B is an output latch/logic block 40 which has two latches, a latch 44A having a data input connected to the bit line 31A and a latch 44B having a data input connected to the complementary bit line 31B. The outputs of the latches 44A and 44B are connected to the inputs of a NOR gate 45 and logic inverter circuit 46. The contents of the latches 44A and 44B are also directly available (to wit, separate from the output of the inverter 46) at the output terminals of the latches 44A and 44B as signals termed "out" and "out_bar" in FIG. 5. The output signal from one of the latches 44A, 44B is selected in an ordinary read operation.

Control over the operation of the sensing architecture includes control lines 51-56. Control line 51 carries a sense enable signal to turn on (and off) PMOS transistors 13A and 13B. When on, these transistors continue the connection of bit line 31A and complementary bit line 31B in the memory block 10 to the sense amplifier 20 and the output latch/logic block 40. Control line 52 carries a signal for the NMOS transistors 23A and 23B to discharge the bit line 31A and complementary bit line 31B to ground for equalizing the two bit lines 31A and 31B. The equalization allows the sense amplifier 20 to read the two bit lines without bias from previous operations. The control line 53 carries a "leaker" control signal to the NMOS transistors 24A and 24B which provide a weak voltage pull down of one of the respective bit lines 31A or 31B if that bit line is low. The control line 54 carries a signal to reset the latches 44A and 44B in the output latch/logic block 40. The two control lines 55 and 56 from the control logic block 41 carry signals to turn on/off the NMOS transistors 42A and 42B. The transistor 42A controls the connection of a current source/sink 21A and a load transistor 22A to the bit line 31A and, in a similar arrangement, the transistor 42B controls the connection of a current source/sink 21B and a load transistor 22B to the bit line 31B.

In a standard read operation, the contents of two complementarily programmed memory cell 11A and 11B in the NVM block 10 are sensed conventionally by the sense amplifier 20, as described earlier. The two complementary logic values in the cells 11A and 11B are temporarily stored in the latches 44A and 44B and the logic value of the selected cell 11A or 11B is selected. As explained above, which latch 44A or 44B is selected is beyond the scope of this invention.

The present invention is directed toward the reading of the cells in the memory block 10 prior to programming with the described differential current sensing architecture to detect any faults in the cells. The reading of the selected memory cells 11A and its complementary cell 11B is performed in two cycles. In the first cycle, the preprogrammed state of the selected memory cell 11A is read. After the discharge control signal on the control line 52 equalizes the bit lines 31A and 31B, the sense enable signal on the control line 51 turns on the transistors 13A and 13B. Through control signals sel0, sel1, and vzfdetect, the control logic block 41 turns on the NMOS transistor 42B while its counterpart, NMOS 42A, is off. The sense amplifier 20 senses the currents through the bit line 31A and the unprogrammed memory cell 11A and through the bit line 31B and the unprogrammed memory cell 11B. But the bit line 31B also has the current from the current source/sink 21B through its load transistor 22B. This quickly pulls the sense amplifier 20 into a state sensing the extra current through the bit line 31B, i.e., a logic state at the logic inverter 26A reflecting little current through the bit line 31A and the complementary logic state at the logic inverter 26B reflecting current through the bit line 31B. The logic state at the output of the logic inverter 26A is captured by the latch 44A. If the memory cell 11A is unprogrammed as desired, the logic state is "0". If the cell 11A is faulty, the logic state is "1".

In the second cycle the preprogrammed state of the complementary memory cell 11B is read. Through the control signals sel0, sel1, and vzfdetect, the control logic block 41 turns on the NMOS transistor 42A while turning off its counterpart, NMOS 42B. The sense amplifier 20 senses the currents through the bit line 31A and the unprogrammed memory cell 11A and through the bit line 31B and the unprogrammed memory cell 11B, but with the bit line 31A also having the current from the current source/sink 21A through its load transistor 22A. This quickly pulls the sense amplifier 20 into a state sensing the extra current through the bit line 31A, i.e., a logic state at the logic inverter 26B reflecting little current through the bit line 31B and the complementary logic state at the logic inverter 26A reflecting current through the bit line 31A. The logic state at the output of the logic inverter 26B is captured by the latch 44B. If the memory cell 11B is unprogrammed as desired, the logic state is "0". If the cell 11B is faulty, the logic state is "1".

It should be noted that the description above assumes that the unprogrammed memory cells are, in fact, unprogrammed. If a selected memory cell is faulty and is in a programmed or quasi-programmed state, the currents supplied by the current source/sinks 21A and 21B are predetermined so as to allow the faulty memory cell to drive the current on its connected bit line 31A or 31B and set the sense amplifier 20 into a logic state indicative of a programmed state, a logic "1" in this example, for the latch 44A or 44B of the faulty memory cell. The NOR gate 45 and inverter 46 respond to the outputs of both latches 44A and 44B. If one or both of the unprogrammed memory cells 11A, 11B are faulty, the vzf output is a logic "1"—a fault in the preprogrammed cell(s) has been detected and the memory cells 11A, 11B can be eliminated prior to any programming of the memory block 10.

In normal operation, the described sensing circuit architecture only requires 1 cycle to sense or read the addressed memory cells 11A, 11B. As in the case of the previous differential sensing of unprogrammed or pre-programmed memory cells with an operational amplifier, the described sensing circuit architecture still requires 2 cycles but the sensing operations can be performed at higher speeds.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. In an integrated circuit having a NVM (non-volatile memory) block having a plurality of memory cells in which a selected memory cell and a complementary memory cell are addressed at a time, a sensing architecture to read logic states of the selected memory cell and complementary memory cell prior to any programming of the NVM block, comprising:
a first bit line connected to the selected memory cell;
a second bit line connected to the complementary memory cell of the selected memory cell;
a sense amplifier having first and second cross-coupled inverters, the first inverter having an input connected to the first bit line and an output connected to the second bit line, the second inverter having an input connected to the second bit line and an output connected to the first bit line, the sense amplifier operating by differential currents in the first and second bit lines;
a first current source/sink controllably connected to the first bit line when a logic state of a complementary memory cell of the selected memory cell is read prior to any programming of the complementary memory cell; and
a second current source/sink controllably connected to the second bit line when a logic state of the selected memory cell is read prior to any programming of the selected memory cell;
whereby the memory cells in the NVM block are read by differential current sensing.

2. The sensing architecture of claim 1 wherein the NVM memory block comprises a plurality of OTP (One-Time Programmable) memory cells.

3. The sensing architecture of claim 1 further comprising a logic block receiving selection control and preprogramming detection control signals to generate control signals to connect the second current source/sink to the second bit line for a reading of the logic state of the selected memory cell through the first bit line; and to connect the first current source/sink to the first bit line for a reading of the logic state of the complementary memory cell through the second bit line.

4. The sensing architecture of claim 3 further comprising:
a first latch having an input connected to the first bit line;
a second latch having an input connected to the second bit line; and
one or more logic circuits receiving the contents of the first and second latches and generating an output signal indicative that both of the selected and complementary memory cells are unprogrammed, or that one or both of the selected and complementary memory cells is faulty.

5. The sensing architecture of claim 1 further comprising:
a first latch having an input connected to the first bit line;
a second latch having an input connected to the second bit line; and
one or more logic circuits receiving the contents of the first and second latches and generating an output signal indicative that both of the selected and complementary memory cells are unprogrammed, or that one or both of the selected and complementary memory cells is faulty.

6. The sensing architecture of claim 5 wherein the output signal indicative that one or both of the selected and complementary memory cells is faulty comprises a logic "1".

7. The sensing architecture of claim 6 wherein the one or more logic circuits comprise the equivalent of an OR gate.

8. The sensing architecture of claim 7 wherein the NVM memory block comprises a plurality of OTP (One-Time Programmable) memory cells.

9. The method of claim 8 further comprising:
latching the logic state of the selected memory cell through the first bit line; and
latching the logic state of the complementary memory cell through the second bit line.

10. The method of claim 9 further comprising:
from the latched logic states of the selected and complementary memory cells, generating an output logic signal indicative that both of the selected and complementary memory cells are unprogrammed, or that one or both of the selected and complementary memory cells is faulty.

11. The method of claim 10 wherein the NVM memory block comprises a plurality of OTP (One-Time Programmable) memory cells.

12. In an integrated circuit having a NVM (non-volatile memory) block having a plurality of memory cells in which a selected memory cell and a complementary memory cell are addressed at a time, a method of operating a sensing architecture to read logic states of the selected memory cell and complementary memory cell prior to any programming of the NVM block, the method comprising:
connecting a first bit line to a selected preprogrammed memory cell;
connecting a second bit line to a complementary preprogrammed memory cell of the selected memory cell;
connecting a first current source/sink to the first bit line when a logic state of a complementary memory cell of the selected memory cell is to be read;
connecting a second current source/sink connected to the second bit line when a logic state of the selected memory cell is to be read; and
connecting the first and second bit lines to a sense amplifier having first and second cross-coupled inverters, the first inverter having an input connected to the first bit line and an output connected to the second bit line, the second inverter having an input connected to the second bit line and an output connected to the first bit line, the sense amplifier into one of two states in response to differential currents in the first and second bit lines;

whereby the selected preprogrammed memory cells and the complementary preprogrammed memory cells in the NVM block are read by differential current sensing.

13. The method of claim 12 wherein the NVM memory block comprises a plurality of OTP (One-Time Programmable) memory cells.

14. The method of claim 13 further comprising:
connecting the second current source/sink to the second bit line for a reading of the logic state of the selected memory cell through the first bit line; and
connecting the first current source/sink to the first bit line for a reading of the logic state of the complementary memory cell through the second bit line.

15. The method of claim 14 further comprising:
latching the logic state of the selected memory cell through the first bit line; and
latching the logic state of the complementary memory cell through the second bit line.

16. The method of claim 15 further comprising:
from the latched logic states of the selected and complementary memory cells, generating an output logic signal indicative that both of the selected and complementary memory cells are unprogrammed, or that one or both of the selected and complementary memory cells is faulty.

17. An integrated circuit comprising:
a memory block having a plurality of OTP (One-Time Programmable) memory cells in which a selected memory cell and a complementary memory cell are addressed at a time;
a first bit line connected to a selected memory cell;
a second bit line connected to the complementary memory cell of the selected memory cell;
a sense amplifier having first and second cross-coupled inverters, the first inverter having an input connected to the first bit line and an output connected to the second bit line, the second inverter having an input connected to the second bit line and an output connected to the first bit line, the sense amplifier operating by differential currents in the first and second bit lines;
a first current source/sink controllably connected to the first bit line when a logic state of a complementary memory cell of the selected memory cell is read prior to any programming of the complementary memory cell; and
a second current source/sink controllably connected to the second bit line when a logic state of the selected memory cell is read prior to any programming of the selected memory cell;
whereby the memory cells in the NVM block are read prior to any programming by differential current sensing.

18. The integrated circuit of claim 17 further comprising:
a logic block receiving selection control and preprogramming detection control signals to generate control signals to connect the second current source/sink to the second bit line for a reading of the logic state of the selected memory cell through the first bit line; and to connect the first current source/sink to the first bit line for a reading of the logic state of the complementary memory cell through the second bit line.

19. The sensing architecture of claim 18 further comprising:
a first latch having an input connected to the first bit line;
a second latch having an input connected to the second bit line; and
one or more logic circuits receiving the contents of the first and second latches and generating an output signal indicative generating an output logic signal indicative that both of the selected and complementary memory cells are unprogrammed, or that one or both of the selected and complementary memory cells is faulty.

20. The sensing architecture of claim 17 further comprising:
a first latch having an input connected to the first bit line;
a second latch having an input connected to the second bit line; and
one or more logic circuits receiving the contents of the first and second latches and generating an output signal indicative that both of the selected and complementary memory cells are unprogrammed, or that one or both of the selected and complementary memory cells is faulty.

* * * * *